(12) United States Patent
Kimura et al.

(10) Patent No.: US 8,922,304 B2
(45) Date of Patent: Dec. 30, 2014

(54) LAMINATED ELECTRONIC DEVICES WITH CONICAL VIAS

(75) Inventors: Kazunari Kimura, Tokyo (JP); Junichi Nakamura, Tokyo (JP); Takeshi Kijima, Tokyo (JP); Isao Abe, Tokyo (JP); Takahiro Suzuki, Yuri-Honjo (JP); Toshiaki Araki, Yuri-Honjo (JP)

(73) Assignee: TDK Corporation, Tokyo (JP)

( * ) Notice: Subject to any disclaimer, the term of this patent is extended or adjusted under 35 U.S.C. 154(b) by 390 days.

(21) Appl. No.: 13/280,734

(22) Filed: Oct. 25, 2011

(65) Prior Publication Data
US 2012/0103675 A1    May 3, 2012

(30) Foreign Application Priority Data
Oct. 29, 2010  (JP) ................................ 2010-244666

(51) Int. Cl.
*H01P 1/203*    (2006.01)
*H05K 3/40*    (2006.01)
*H05K 3/46*    (2006.01)

(52) U.S. Cl.
CPC .......... *H05K 3/4061* (2013.01); *H01P 1/20345* (2013.01); *H05K 3/4629* (2013.01)
USPC ....................................................... 333/204

(58) Field of Classification Search
USPC ....................................................... 333/204
See application file for complete search history.

(56) References Cited

U.S. PATENT DOCUMENTS

| | | | |
|---|---|---|---|
| 5,825,266 A | 10/1998 | Gehrke | |
| 2001/0020548 A1* | 9/2001 | Burgess | 174/262 |
| 2005/0067711 A1* | 3/2005 | Opheim | 257/774 |
| 2007/0171005 A1* | 7/2007 | Fukunaga | 333/219 |
| 2009/0242261 A1 | 10/2009 | Takenaka et al. | |

FOREIGN PATENT DOCUMENTS

| | | |
|---|---|---|
| CN | 1292635 A | 4/2001 |
| CN | 1377216 A | 10/2002 |
| CN | 101106121 A | 1/2008 |
| JP | 2-134889 | 5/1990 |
| JP | 4-105393 | 4/1992 |
| JP | 2000-12736 | 1/2000 |
| JP | 2002-337096 | 11/2002 |
| JP | 2003-46248 A | 2/2003 |
| JP | 2004-311919 A | 11/2004 |
| JP | 2004-356910 A | 12/2004 |
| JP | 2008-35565 A | 2/2008 |
| TW | 200618705 | 6/2006 |
| WO | WO 98/20557 A1 | 5/1998 |
| WO | WO 2010/010911 A1 | 1/2010 |

OTHER PUBLICATIONS

Machine Translation of JP 2004-356910, provided by examiner, translated Jun. 2, 2014.*
Japanese Office Action issued Feb. 5, 2014, in Japan Patent Application No. 2010-244666.
Combined Chinese Office Action and Search Report issued Dec. 4, 2013 in Patent Application No. 201110339478.3

* cited by examiner

*Primary Examiner* — Stephen Jones
*Assistant Examiner* — Scott S Outten
(74) *Attorney, Agent, or Firm* — Oblon, Spivak, McClelland, Maier & Neustadt, L.L.P.

(57) ABSTRACT

A laminated electronic device comprises two or more wiring layers including a first wiring layer and a second wiring layer, an insulating layer interposed between the first wiring layer and second wiring layer, and a through conductor extending through the insulating layer for electrically connecting a first conductor disposed on the first wiring layer to a second conductor disposed on the second wiring layer. The through conductor includes divergent sections at both ends, which have a diameter gradually increased toward the first conductor or second conductor.

5 Claims, 14 Drawing Sheets

FIG. 7

| | FIRST EXAMPLE (FIG. 2) | SECOND EXAMPLE (FIG. 3) | COMPARATIVE EXAMPLE 1 (FIG. 4) | COMPARATIVE EXAMPLE 2 (FIG. 5) | COMPARATIVE EXAMPLE 3 (FIG. 5) | COMPARATIVE EXAMPLE 4 (FIG. 6) | COMPARATIVE EXAMPLE 5 (FIG. 6) |
|---|---|---|---|---|---|---|---|
| DIAMETER OF UPPER END [μm] | 200 | 100 | 100 | 100 | 100 | 100 | 100 |
| DIAMETER OF INTERMEDIATE SECTION [μm] | 100 | 100 | 100 | 100 | 100 | 100(50) | 100(80) |
| DIAMETER OF LOWER END [μm] | 200 | 200 | 100 | 50 | 80 | 100 | 100 |
| Q-VALUE | 108.64 | 106.68 | 104.30 | 99.97 | 103.28 | 99.99 | 103.52 |

FIG. 8

|  | COMPARATIVE EXAMPLE 1 (FIG. 4) | EXAMPLE 2-1 | EXAMPLE 2 (FIG. 3) | EXAMPLE 2-2 | EXAMPLE 2-3 | EXAMPLE 2-4 | EXAMPLE 2-5 |
|---|---|---|---|---|---|---|---|
| DIAMETER OF UPPER END [μm] | 100 | 100 | 100 | 100 | 100 | 100 | 100 |
| DIAMETER OF INTERMEDIATE SECTION [μm] | 100 | 100 | 100 | 100 | 100 | 100 | 100 |
| DIAMETER OF LOWER END [μm] | 100 | 150 | 200 | 250 | 300 | 400 | 500 |
| Q-VALUE | 104.30 | 105.90 | 106.68 | 106.72 | 106.28 | 106.10 | 105.92 |

FIG. 11

| DIAMETER P OF BOTTOM OF DIVERGENT SECTION [μm] | 100 | 150 | 200 | 250 | 300 | 400 | 500 |
|---|---|---|---|---|---|---|---|
| ANGLE α [°] | 90 | 122.0054 | 141.3402 | 151.9290 | 158.1986 | 165.0668 | 168.6901 |
| ANGLE β [°] | 180 | 147.9946 | 128.6598 | 118.0710 | 111.8014 | 104.9332 | 101.3099 |
| Q-VALUE | 104.30 | 105.90 | 106.68 | 106.72 | 106.28 | 106.10 | 105.92 |

FIG. 14

| | EXAMPLE 3-1 (FIG. 12) | EXAMPLE 3-2 | EXAMPLE 3-3 |
|---|---|---|---|
| DIAMETER OF UPPER END [μm] | 100 | 100 | 100 |
| DIAMETER OF INTERMEDIATE PORTION [μm] | 100 | 100 | 100 |
| DIAMETER OF LOWER END OF DIVERGENT SECTION [μm] | 100→300→500 | 100→200→500 | 100→110→150→250→500 |
| Q-VALUE | 108.88 | 108.47 | 108.53 |

LAMINATED ELECTRONIC DEVICES WITH CONICAL VIAS

BACKGROUND OF THE INVENTION

The present invention relates to laminated electronic devices and a method of manufacturing the same, and more particularly to the structure of through conductors (throughhole conductors) which are suitable for application to laminated electronic devices including resonators such as filters.

A variety of laminated electronic devices have been provided. Such laminated electronic devices have a variety of functions implemented by circuits formed of internal conductors of laminates which include a plurality of wiring layers. For example, a laminated filter which comprises a resonator in an internal wiring layer of a ceramic laminate performs functions of selecting a frequency and removing unwanted waves in high-frequency radio communication systems such as a mobile phone, a wireless LAN, Bluetooth®, WiMAX™, and the like, and constitutes one of main components in these communication systems.

Laminates may be implemented, for example, by ceramic laminates which are advantageous in achieving a smaller size and a higher integration. In manufacturing a laminate, conductor patterns are formed on surfaces of a plurality of ceramic green sheets, which are then stacked one on another and bonded with one another with heat and pressure. The resulting product is next cut into chips which are then sintered, thus completing laminates. Here, through conductors (throughhole conductors) extending vertically (in the laminating direction) through insulating layers are generally employed for electrically interconnecting electrodes which are arranged on different wiring layers within a laminate.

Such throughhole conductors are disclosed, for example, in JP-A-2-134889 and JP-A-4-105393.

SUMMARY OF THE INVENTION

For the aforementioned electronic device which utilizes the resonation phenomena, such as a filter, a high Q-value (Quality factor) is required in order to provide good electric characteristics.

However, with recent requests for a reduction in size and thickness of electronic equipment, a reduction in size and profile is highly required for electronic devices which comprise such electronic equipment, causing difficulties in achieving a high Q-value. This is because a more reduction in size and profile of devices would inevitably cause electrodes to be placed closer to each other or result in a smaller space available for routing inductor conductors, and because the Q-value of a resonator is generally in a contradictory relationship to the size of devices.

On the other hand, a variety of techniques have been conventionally devised, for example, in arrangement, shape, and the like of conductor patterns which form part of a resonator, in order to accomplish good characteristics even with smaller and lower-profile electronic devices. However, electronic devices have been and are being tremendously advanced to provide more functions and improve performance, so that it is envisioned that increasingly more demands will be made for the structure of devices capable of providing a high Q-value which can support such advancement.

In view of the foregoing, the present invention is intended to accomplish a high Q-value from a novel viewpoint of improving conductors for connection, particularly, throughhole conductors for interconnecting wiring layers, rather than a resonator itself, as has been done in the past. It should be noted that while the above-cited patent documents relate to throughhole conductors, they are both intended to prevent defective connections due to an insufficient amount or varying amount of conductive paste filled into holes, and do not disclose the relationship between throughhole conductors and resonant characteristics.

It is therefore an object of the present invention to increase the Q-value of a resonator in a laminated electronic device, thereby improving electric characteristics of the electronic device.

To solve the aforementioned problem and achieve the object, a laminated electronic device according to the present invention includes two or more wiring layers including a first wiring layer and a second wiring layer, an insulating layer interposed between the first wiring layer and the second wiring layer, and a through conductor extending through the insulating layer to electrically connect a first conductor disposed on the first wiring layer to a second conductor disposed on the second wiring layer, wherein the through conductor includes a divergent section having a diameter which is gradually larger toward the first conductor, and the divergent section is formed in one end portion of the through conductor, which serves as a connection to the first conductor.

The electronic device according to the present invention has a through conductor for electrically interconnecting the first conductor and second conductor disposed on different wiring layers insulated from each other by the insulating layer, where the through conductor includes a divergent section in one end portion of the through conductor. The divergent section has a tapering shape with the diameter gradually increasing toward the first conductor to which the through conductor is connected.

The present inventors reached the completion of the present invention in the course of repeated investigations made on resonators particularly with a focus on a through conductor for interconnecting wiring layers without adhering to conventionally made improvements on the resonator itself in regard to the arrangement, shape, and the like of conductor patterns which form part of a resonator. Specifically, the inventors found that the Q-value increased by tapering an end portion of a through conductor included in a filter as described above. This aspect will be described later in greater details in Description of Embodiments based on the result of simulations.

The divergent section as described above is preferably formed not only in one end portion of the through conductor but also in the other end portion thereof. Accordingly, in one aspect of the present invention, the through conductor further includes a divergent section having a diameter which is gradually larger toward the second conductor, where the divergent section is formed in the other end portion of the through conductor, and the other end portion serves as a connection to the second conductor.

The through conductor is preferably made of a conductive material which is filled in the throughhole extending through the insulating layer, i.e., implemented as a so-called filled via which is a hole filled with a conductive material. This is because such a through conductor reduces the electric resistance therein, and if a void exists within a laminate, a resulting electronic device may likely deteriorate in mechanical strength due to a crack running into the laminate, caused by thermal expansion during a subsequent heating process (for example, a reflow process). The through conductor having the throughhole filled with a conductive material can prevent such inconveniences to improve the reliability of the electronic device. Specifically, such a through conductor can be formed by filling, for example, a conductive paste into a throughhole formed through a laminate in such a manner that the divergent sections are included in end portions, or by depositing a plated metal, and the like.

As a typical exemplary configuration of the present invention, the laminated electronic device includes one or more resonator or inductor, where the through conductor is connected to the resonator or inductor. However, the through conductor, as called in the present invention, is not necessarily limited to such one that is directly connected to a resonator or an inductor, but a through conductor may be indirectly connected to a resonator or an inductor via another circuit element, for example, an input capacitor, an output capacitor, or the like. Further alternatively, a through conductor may connect conductors to each other (for example, an input terminal electrode, an output terminal electrode, a ground electrode, and the like), other than a resonator and an inductor.

Also, the electronic device, as called in the present invention, is not limited to a discrete device (so-called chip device) which provides a single function, for example, a chip filter, a chip inductor, and the like, but may include an electronic module which comprises a plurality of electric functional elements within a laminated board, for example, a wireless LAN module, a front end module for a mobile communication terminal, and the like. Also, in regard to the type of electronic device, the electronic device is not limited to filter-based ones such as a bandpass filter, a low pass filter, a high pass filter, a duplexer, a diplexer, and the like, but may include a variety of electronic devices and modules which are required to exhibit a high Q-value as the electric characteristics, such as an oscillator exemplified by VCO (voltage controlled oscillator), a mixer, and the like.

Expressed another way about the shape of the divergent section, which is a feature of the present invention, the divergent section may be said to be a frusto-conical connection which extends toward a connecting surface with the first conductor (or second conductor), or conversely, a sinkhole-like connection which has a diameter gradually reduced toward the intermediate section of the through conductor, when viewed from the first conductor (or second conductor).

In one preferred aspect of the present invention, the laminated electronic device may have the following structure.

The through conductor includes an intermediate section having a substantially fixed diameter, and the divergent section in a frusto-conical shape. The divergent section includes one end surface continuous to the intermediate section, serving as a connection to the intermediate section, and having a diameter substantially identical to the diameter of the intermediate section, and the other end surface having a diameter larger than the diameter of the one end surface. The diameter of the other end surface of the divergent section P is substantially equal to (2L+H), where H represents the diameter of the intermediate section, and L represents the height of the divergent section. As will be apparent from Description of Embodiments presented below, the Q-value can be more increased by employing such a structure for the shape of the divergent section.

A method of manufacturing a laminated electronic device according to the present invention is intended to manufacture a laminated electronic device which has a through conductor including a divergent section as described above, for electrically interconnecting conductive films disposed on different wiring layers.

Specifically, a first manufacturing method involves laminating ceramic green sheets after the divergent section is formed. This method includes the steps of forming a tapered throughhole through a first ceramic green sheet from one surface to the other surface thereof such that the throughhole has a gradually smaller diameter from the one surface toward the other surface of the first ceramic green sheet; forming a tapered throughhole through a second ceramic green sheet from one surface to the other surface thereof such that the throughhole has a gradually smaller diameter from the one surface toward the other surface of the second ceramic green sheet; filing a conductive material into the throughhole of the first ceramic green sheet to form one end portion of the through conductor; filling a conductive material into the throughhole of the second ceramic green sheet to form another end portion of the through conductor; placing a first conductive film on the one surface of the first ceramic green sheet such that the first conductive film is electrically connected to the one end portion of the through conductor; placing a second conductive film on the one surface of the second ceramic green sheet such that the second conductive film is electrically connected to the other end portion of the through conductor; and laminating a plurality of ceramic green sheets including the first ceramic green sheet and the second ceramic green sheet, such that the other surface of the first ceramic green sheet opposes the one surface of the second ceramic green sheet.

In the first manufacturing method described above, another ceramic green sheet may be interposed between the first ceramic green sheet and the second ceramic green sheet. When such a structure is employed, an intermediate section of the through conductor is formed of the other ceramic green sheet between the one and other end portions of the through conductor, where the through conductor is made up of the one end portion, intermediate section, and other end portion of the through conductor.

Also, another ceramic green sheet may be laminated on the one surface of the first ceramic green sheet and on the one surface of the second ceramic green sheet. Further, a first conductor is placed on the one surface of the first ceramic green sheet such that the first conductor is electrically connected to the one end of the through conductor, and a second conductor is placed on the one surface of the second ceramic green sheet such that the second conductor is electrically connected to the other end of the through conductor.

In a preferred aspect of the first manufacturing method, the throughhole formed through the first ceramic green sheet has a diameter on the other surface thereof substantially equal to the diameter of the throughhole formed through the second ceramic green sheet on the other surface. The manufacturing method further includes the steps of forming a throughhole through each of one or more third ceramic green sheets, where the throughhole has a diameter substantially equal to the diameter of the throughhole on the other surface of the first ceramic green sheet and substantially equal to the diameter of the throughhole on the other surface of the second ceramic green sheet; and filling a conductive material into the throughhole formed through the one or more third ceramic green sheets to form one or more intermediate section of the through conductor in each the third ceramic green sheet. The step of laminating the plurality of ceramic green sheets includes laminating a plurality of ceramic green sheets including the first ceramic green sheet, the second ceramic green sheet, and the third ceramic green sheets, such that the one or more third ceramic green sheets are interposed between the first ceramic green sheet and the second ceramic green sheet, the one or more intermediate sections of the through conductor are electrically connected to each other, one end of the one or more intermediate sections of the through conductor is electrically connected to one end portion of the through conductor, and the other end of the one or more intermediate sections of the through conductor is electrically connected to the other end portion of the through conductor.

Also, a second manufacturing method according to the present invention involves forming the divergent section after laminating a plurality of ceramic green sheets.

Specifically, this second manufacturing method is provided to manufacture a laminated electronic device which includes a through conductor for interconnecting conductive films disposed on different wiring layers. The method includes the steps of laminating two or more ceramic green sheets to create a laminated sheet; piercing a throughhole extending through the laminated sheet to form a through conductor; processing one end portion of the throughhole into a tapered shape such that the throughhole has a diameter gradually reduced from one end of the throughhole to an intermediate section of the throughhole; processing another end portion of the throughhole into a tapered shape such that the throughhole has a diameter gradually reduced from the other end of the throughhole to the intermediate section of the throughhole; filling a conductive material into the throughhole to form the through conductor; placing a first conductive firm for electrical connection to the one end portion of the through conductor; and placing a second conductor film for electrical connection to the other end portion of the through conductor.

According to the present invention, the Q-value of a resonator can be increased in a laminated electronic device, thereby improving the electric characteristics of the electronic device.

Other objects, features, and advantages of the present invention will become apparent from the following description of embodiments of the present invention which is made with reference to the accompanying drawings. It should be apparent to those skilled in the art that the present invention is not limited to the following embodiments, but can be changed in various manners without departing from the scope of the invention defined by the appended claims. Also, in the respective drawings, like reference numerals designate the same or similar elements.

BRIEF DESCRIPTION OF THE DRAWINGS

FIG. 7 is a table showing the result of calculating the dimensions of respective sites of throughhole conductors and the Q-values in the embodiment and comparative examples;

FIG. 8 is a table showing the result of consideration on the influence of the shape of a divergent section (to which extent the diameter may be increased) on the Q-value;

FIG. 11 is a table showing the relationship among the diameter P, angle α and angle β of the lower end of the divergent section, together with the relationship among the diameter P of the lower end of the divergent section and the Q-value;

FIG. 14 is a table showing the result of consideration on the influence of the shape of a divergent section on the Q-value when the slope of the divergent section is changed in steps;

DESCRIPTION OF THE EMBODIMENTS

Figure 1:
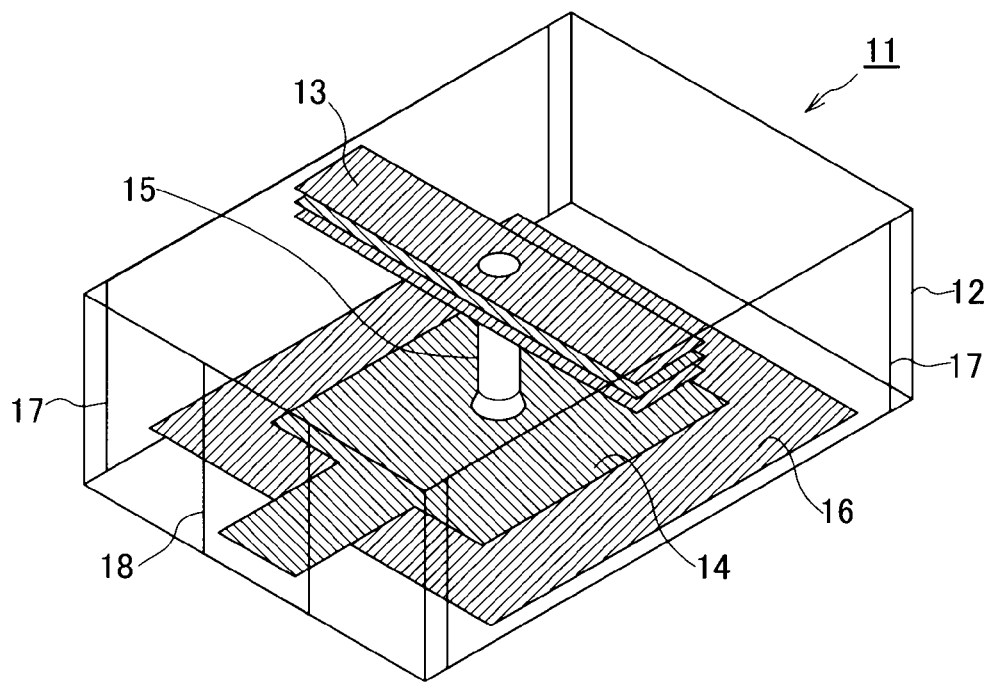
FIG. 1 is a perspective view schematically showing a laminated electric device according to one embodiment of the present invention, illustrating the interior of the device therethrough.
Figure 2:
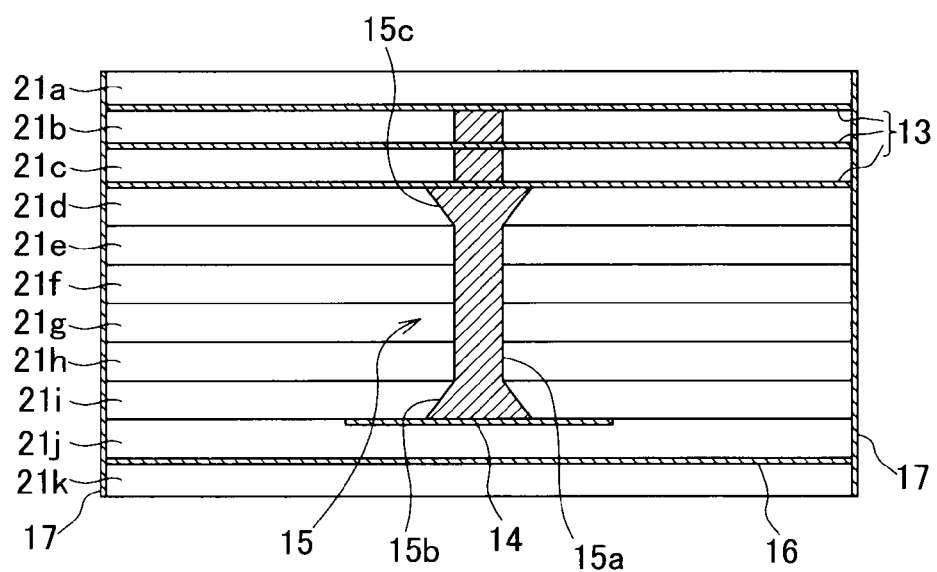
FIG. 2 is a cross-sectional view schematically showing a laminated electronic device (Example 1) according to the embodiment.

As shown in FIGS. 1 and 2, a laminated electronic device 11 according to one embodiment of the present invention is a filter in the form of chip, which comprises a resonator 13 within a ceramic laminate 12. The laminate 12 comprises a plurality of laminated ceramic green sheets 21a-21k (hereinafter simply called the "sheets" in some cases). The laminate 12 comprises a plurality of internal wiring layers formed on surfaces of the sheets 21a-21k. The resonator 13 is placed on an upper wiring layer of the laminate 12, and is electrically connected to an electrode 14 placed on a lower wiring layer of the laminate 12 through a throughhole conductor 15.

In addition, the electrode 14 is provided with a ground electrode 16 arranged on a lower layer thereof, and the laminate 12 is provided with lateral terminal electrodes 17, 18 respectively arranged on the peripheral surface thereof. While one resonator 13, and the throughhole conductor 15 and electrodes 14, 16, 17 connected thereto are solely depicted in the laminate 12 in FIGS. 1 and 2 as well as the following drawings, it should be appreciated that other than these components, the electronic device 11 has resonators, electrodes, terminals, and the like (not shown). Also, the number of wiring layers (the number of laminated ceramic green sheets) in the laminate 12 is not limited to the illustrated example, but there may be a larger or a smaller number of wiring layers than the illustrated ones.

The throughhole conductor 15 connected to the resonator 13 is formed of an electrically conductive material (electrically conductive paste) filled in a throughhole which extends through a plurality of sheets (insulating layers), and includes a cylindrical intermediate section 15a which has a fixed width (diameter), a frusto-conical lower divergent section 15b (having a trapezoidal shape in cross-section) having a diameter gradually extending downward from the lower end of the intermediate section 15a, and an inverted frusto-conical upper divergent section 15c (having an inverted trapezoidal shape in cross-section) having a diameter gradually extending upward from the upper end of the intermediate section 15a.

Notably, for throughhole conductors for interconnecting other electrodes (other resonators, input/output terminal electrodes, ground electrode and the like, none of which are illustrated) contained in the chip filter 11, they preferably comprises a frusto-conical divergent section 15b and an inverted frusto-conical divergent section 15c formed on both ends thereof, like the throughhole conductor 15 as described above, in order to increase the Q-value of each resonator and improve the electric characteristics of the filter 11.

[Influence of Shape of Throughhole Conductor on Q-Value]

The inventors investigated the influence of the shape of a throughhole conductor exerted on the Q-value of a resonator.

Figure 3:
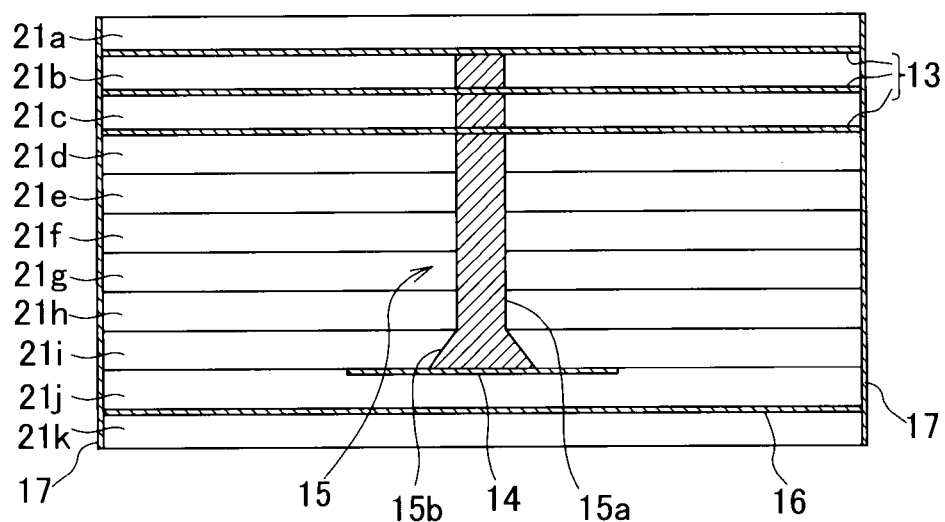
FIG. 3 is a cross-sectional view showing another structure (Example 2) of a laminated electronic device according to the embodiment.
Figure 4:
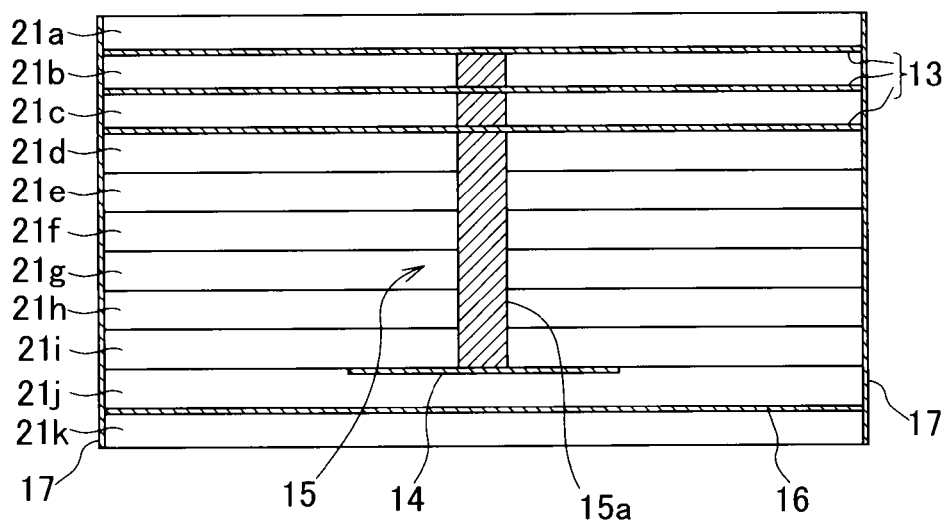
FIG. 4 is a cross sectional view showing the structure of a laminated electronic device according to a comparative example (Comparative Example 1) for comparison with the embodiment.
Figure 5:
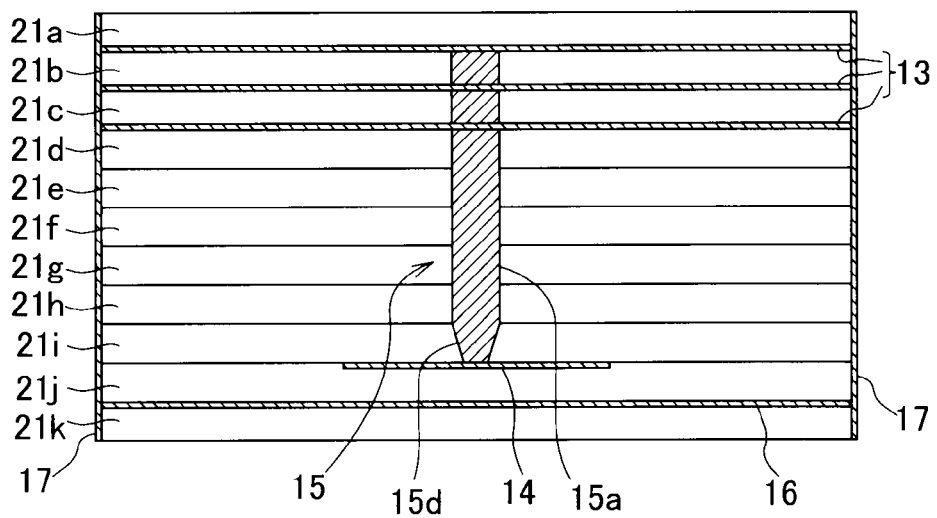
FIG. 5 is a cross-sectional view showing the structures of laminated electronic devices according to comparative examples (Comparative Examples 2, 3) for comparison with the embodiment.
Figure 6:
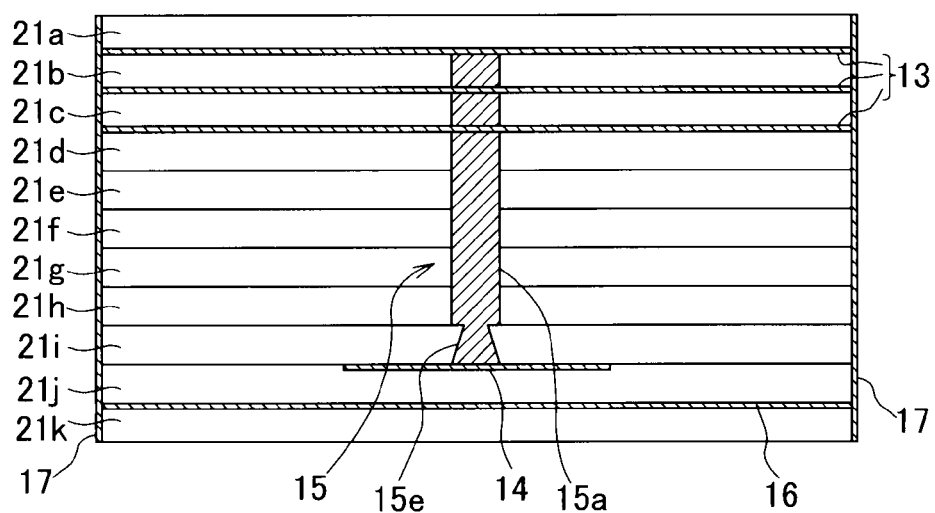
FIG. 6 is a cross-sectional view showing the structures of laminated electronic devices according to comparative examples (Comparative Examples 4, 5) for comparison with the embodiment.

Specifically, the Q-value was calculated through simulation for each of the following exemplary structures:

the structure of the embodiment shown in FIG. 2 (called Example 1);

a throughhole conductor formed with a divergent section 15b, similar to that of Example 1, only in a lower portion thereof, as shown in FIG. 3 (called Example 2);

Comparative Example 1 which represents a cylindrical throughhole conductor having the same width (diameter) along its entire length, as shown in FIG. 4;

Comparative Example 2 which represents a throughhole conductor having a downwardly tapered lower end portion, as shown in FIG. 5 (a portion indicated at reference numeral 15d in FIG. 5);

Comparative Example 3 which represents a throughhole conductor formed with a downwardly tapered lower end portion, similar to Comparative Example 2, but having the leading end (lower end) of the tapered lower end portion larger than that of Comparative Example 2;

Comparative Example 4 which represents a throughhole conductor including a frusto-conical lower end portion 15e at the lower end of a cylindrical intermediate section 15a, as shown in FIG. 6, where this lower end portion 15e has the lower end which is equal in width to an intermediate section 15a, and the upper end, i.e., the surface connected to the intermediate section 15a, is smaller in width than the intermediate section 15a; and Comparative Example 5 which represents a throughhole conductor having a frusto-conical lower end portion 15e, similar to Comparative Example 4, the upper end of which is larger than that of Comparative Example 4.

For reference, all of the throughhole conductors 15 have the same overall height dimension (length from the upper end to the lower end) equal to 650 μm, and the end portions (divergent sections 15b, 15d, 15e), subjected to machining for changing the diameter, all have the same height dimension equal to 40 μm. Also, the tapered lower end portion of Comparative Example 2 has the diameter of 50 μm at the leading end (lower end); the tapered lower end portion of the Comparative Example 3 has the diameter of 80 μm at the leading end (lower end); the frusto-conical lower end portion 15e of Comparative Example 4 has the diameter of 50 μm at the upper end; and the frusto-conical lower end portion 15e of Comparative Example 5 has the diameter of 80 μm at the upper end.

The result of the simulation is as shown in FIG. 7, from which it is apparent that the structures according to the embodiment of the present invention (Examples 1, 2) can provide higher Q-values than the conventional throughhole conductor having a simple cylindrical shape (Comparative Example 1) and Comparative Examples 2-5. It should be noted that a higher Q-value can be provided by Example 2 (FIG. 3) which includes a throughhole conductor formed with a divergent section only in one end portion thereof, than the conventional structure (Comparative Example 1) and Comparative Examples 2-5, but Example 1 with divergent sections formed at both ends is more preferable for achieving a higher Q-value.

Through conductors have been conventionally employed for interconnecting conductors placed on different wiring layers. These throughhole conductors are preferably designed to have a smallest possible diameter (width) from a viewpoint of ensuring a sufficient mechanical reliability of an associated electronic device, in other words, from a view point of ensuring a certain mechanical strength by preventing an associated electronic device from cracking during a sintering process or when the electronic device is mounted on a mounting board through reflow, or due to the difference in coefficient of thermal expansion between the throughhole conductor and insulating layers during long-term use by a user. On the other hand, from a viewpoint of reducing the electric resistance, and increasing the Q-value to improve the electric characteristics, the throughhole conductors are more suitable as they have larger diameters. The through conductors according to the present invention and embodiment have conductor structures which can satisfy, with finesse, both of the reliability and electric characteristics of such devices.

The inventors further investigated the influence of the shape of the divergent section (degree of divergence of the diameter) exerted on the Q-value. Specifically, in the structure of Example 2 shown in FIG. 3, the Q-value was calculated while varying the diameter of the bottom (lower surface) of the divergent section 15b which serves as a connecting surface with the electrode 14. In particular, as shown in a table of FIG. 8, the diameter of the bottom (lower end) of the divergent section 15b was varied from 100 µm to 500 µm. As the lower end has a larger diameter, the frusto-conical divergent section 15b diverges more downwards with a more gently sloping peripheral surface. Notably, when the lower end has the diameter of 100 µm, the resulting structure is the same as that of Comparative Example 1 shown in FIG. 4, while when the lower end has the diameter of 200 µm, the resulting structure is the same as that of Example 2 shown in FIG. 3.

Figure 9:
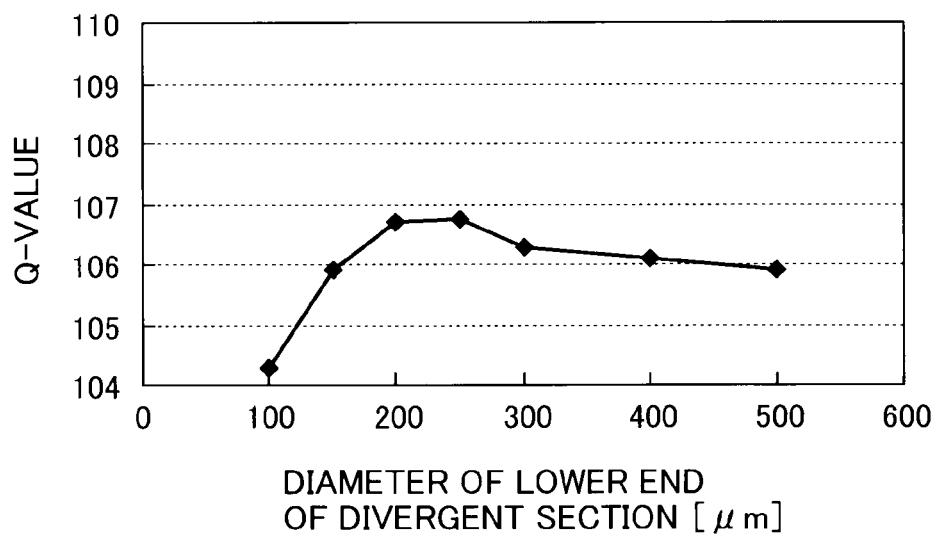
FIG. 9 is a graph showing how the shape of the divergent section (to which extent the diameter may be increased) influences the Q-value.

The result of the calculation is as shown in the lowermost row of FIG. 8 and FIG. 9. As is apparent from these figures, it cannot be said that the lower end of the divergent section may simply be expanded. Accordingly, the inventors further made investigations to find an optimal condition related to the shape of the divergent section.

Figure 10:
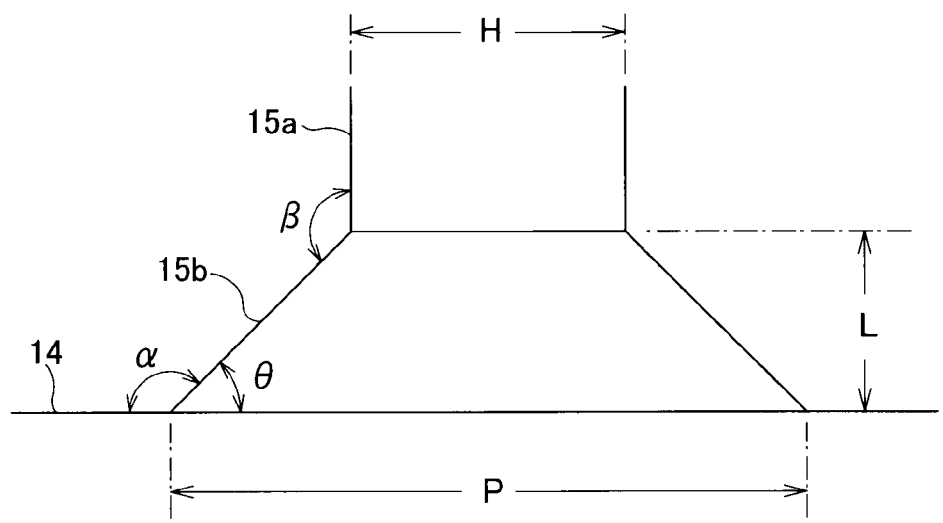
FIG. 10 is a diagram showing the divergent section of the embodiment in an enlarged view.
Figure 12:
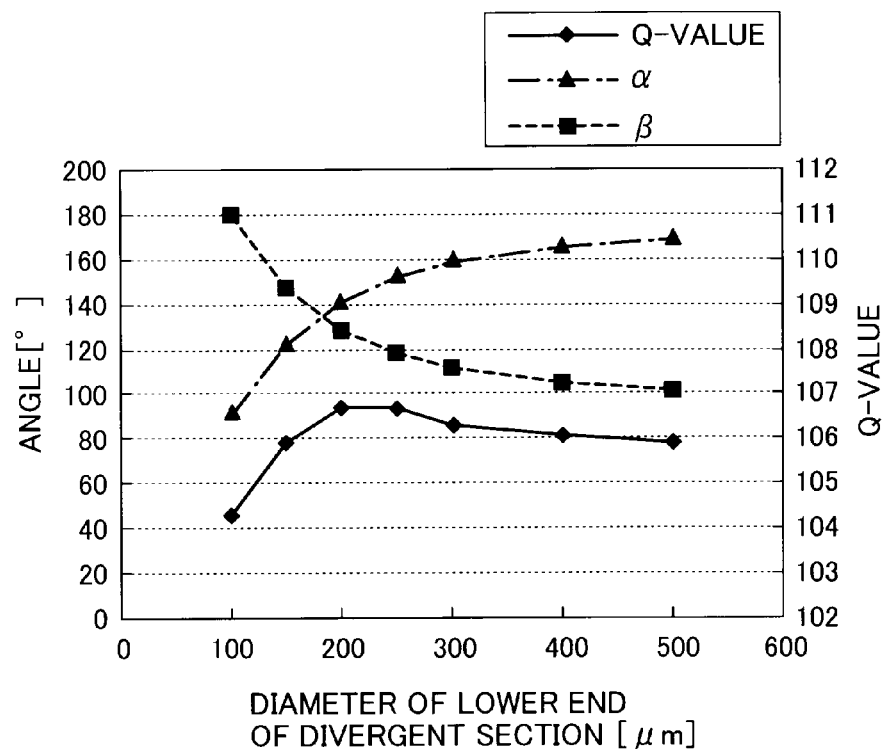
FIG. 12 is a graph showing the relationship among the diameter P, angle α and angle β of the lower end of the divergent section, together with the relationship among the diameter P of the lower end of the divergent section and the Q-value.

As shown in FIG. 10, H denotes the diameter of the throughhole intermediate section 15a; P, the diameter of the bottom of the divergent section 15b; L, the height of the divergent section 15b; θ, the angle formed by the bottom of the divergent section 15b with the peripheral surface (frusto-conical slope) of the divergent section 15b; α, the angle formed by the peripheral surface of the divergent section 15b with the electrode 14; and β, the angle formed by the peripheral surface of the divergent section 15b with the peripheral surface of the throughhole intermediate section 15a. FIGS. 11 and 12 are a table and a graph, respectively, showing the relationship between the diameter P of the divergent section at the lower end, angle α, and angle β, together with the relationship between the diameter P of the divergent section at the lower end and the Q-value (the result of the simulation shown in the aforementioned FIG. 9), where α (indicated by a one-dot chain line) and β (indicated by a broken line) are in a trade-off relationship.

Referring to FIG. 10, the following equation is established:

$$\alpha = \pi - \theta \quad \text{(Equation 1)}$$

Here, since $\tan\theta = L/\{(P-H)/2\}$, the above Equation 1 can be rewritten to the following equation:

$$\alpha = \pi - [\arctan\{2L/(P-H)\}] \quad \text{(Equation 2)}$$

Also, the relationship between α and β can be expressed by the following Equation 3:

$$\beta = (3\pi/2) - \alpha \quad \text{(Equation 3)}$$

As can be seen from FIGS. 11 and 12, since the Q-value approximately reaches a maximum value when α=β, α and β at this time can be expressed as follows:

$$\alpha = \beta = 3\pi/4 \quad \text{(Equation 4)}$$

where θ=π/4.

Accordingly, the following Equation 5 can be derived from the aforementioned Equation 2 and Equation 4, and the diameter P of the divergent section at the lower end is preferably chosen to be approximately (2L+H) in order to maximize the Q-value.

$$P = 2L + H \quad \text{(Equation 5)}$$

Figure 13:
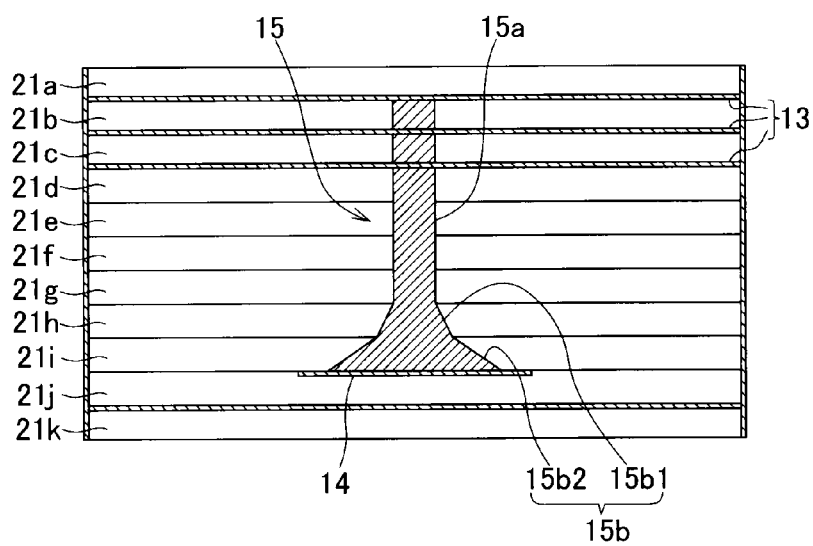
FIG. 13 is a cross-sectional view showing another structure of the divergent section.

The inventors further investigated a throughhole conductor with a divergent section which had a slope of step-wisely varied inclinations. Specifically, as shown in FIG. 13, the lower divergent section 15b was comprised of two sections: a first divergent section 15b1 which extends downward from the lower end of the throughhole intermediate section 15a, and a second divergent section 15b2 which extends further downward from the lower end of this first divergent section and is connected to the electrode 14 (this structure is called "Example 3-1").

Here, as shown in FIG. 14, in this Example 3-1, the diameter of the lower end (bottom) of the first divergent section 15b1 was chosen to be 300 µm (the diameter of the upper end of the second divergent section 15b2 was also chosen to be 300 µm), and the diameter of the lower end (bottom) of the second divergent section 15b2 was chosen to be 500 µm. Example 3-2 and Example 3-3 were also created, and the Q-values were calculated for these Examples. Similar to this Example 3-1, Example 3-2 included a lower divergent section 15b comprised of a first divergent section 15b1 and a second divergent section 15b2, with the diameter of the lower end (bottom) of the first divergent section 15b1 being chosen to be 200 µm. Example 3-3 included a lower divergent section 15b formed in four steps, i.e., a first divergent section, a second divergent section, a third divergent section, and a fourth divergent section, arranged in order from the lower end of the throughhole intermediate section 15a toward the electrode 14, and the diameters of the lower ends of these respective first through fourth divergent sections were chosen to be wider in steps, such as 110 µm, 150 µm, 250 µm, and 500 µm in order. It should be noted that in these Examples 3-1-3-3, the lower divergent sections were all formed through the thickness of two ceramic green sheets.

The result of calculating the Q-values is as shown in the table of FIG. 14, from which it can be seen that satisfactory Q-values were achieved substantially to a similar extent even when the peripheral surface of the divergent section was varied in steps as described above.

[First Manufacturing Method]

A first method of manufacturing an electronic device according to the aforementioned embodiment will now be described with reference to FIGS. 15 to 25.

Figure 15:
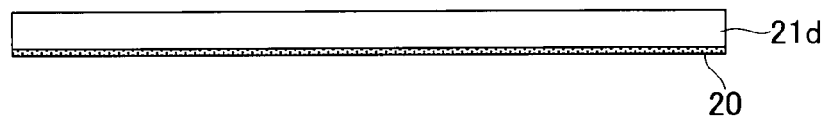
FIG. 15 is a diagram showing one step (a step of forming an upper divergent section of a throughhole conductor) in a first method of manufacturing a laminated electronic device according to the embodiment.
Figure 16:
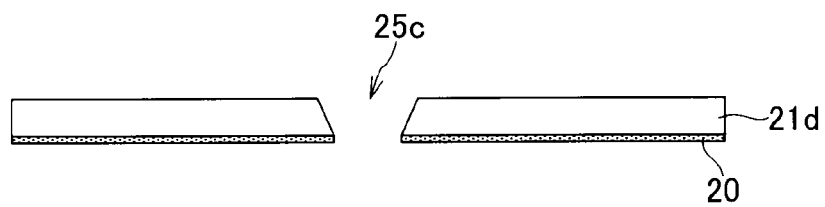
FIG. 16 is a diagram showing one step (a step of forming the upper divergent section of the throughhole conductor) in the first method of manufacturing a laminated electronic device according to the embodiment.

As shown in FIG. 15, a ceramic green sheet 21d is prepared, and a throughhole 25c is formed through the sheet 21d at a predetermined position (at which a throughhole conductor 15 should be formed), as shown in FIG. 16. The throughhole 25c has a tapered inner surface which has a larger diameter on the top and a smaller diameter on the bottom. The throughhole 25c in such a tapered shape can be formed using a laser. By adjusting the intensity of the laser and an irradiation time, a throughhole can be formed through the ceramic green sheet 21d such that the throughhole has a larger diameter on the side which is irradiated with the laser and a smaller diameter on the opposite side.

Alternatively, such a tapered throughhole like 25c can be formed through a mechanical process, for example, using a punch (forcing punch) which has a leading end that is tapered in an inverted frusto-conical shape, to obliquely expand the proximal end of the throughhole. Also, while this embodiment uses a ceramic green sheet including a supporting film (PET film) 20, a sheet without such a supporting film 20 may also be used instead.

Figure 17:
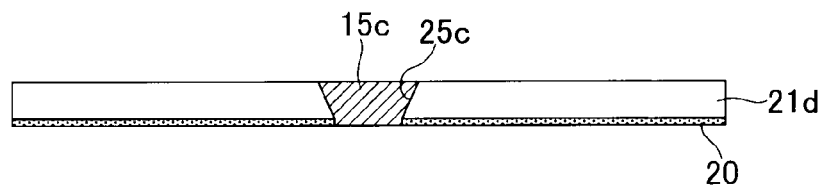
FIG. 17 is a diagram showing one step (a step of forming the upper divergent section of the throughhole conductor) in the first method of manufacturing a laminated electronic device according to the embodiment.
Figure 18:
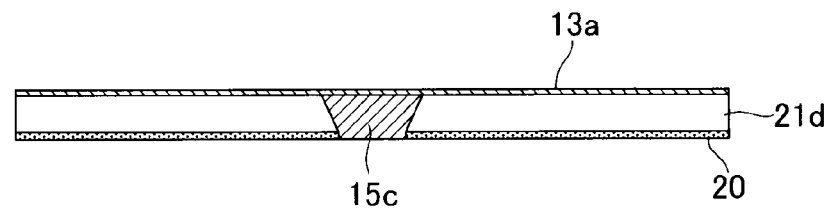
FIG. 18 is a diagram showing one step (a step of forming the upper divergent section of the throughhole conductor) in the first method of manufacturing a laminated electronic device according to the embodiment.

After piercing the tapered hole 25c, a conductive paste is filled into the throughhole 25c to form an upper divergent section 15c, as shown in FIG. 17. Then, as shown in FIG. 18, a conductive film 13a is formed on the surface of the sheet 21d in such a manner that the film 13a is electrically connected to the upper divergent section 15c. The conductive film 13a later forms part of the resonator 13.

Figure 19:
FIG. 19 is a diagram showing one step (a step of forming a lower divergent section of the throughhole conductor) in the first method of manufacturing a laminated electronic device according to the embodiment.
Figure 20:
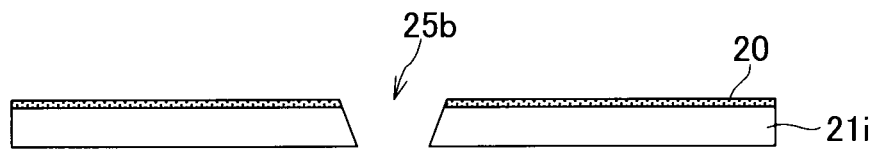
FIG. 20 is a diagram showing one step (a step of forming the lower divergent section of the throughhole conductor) in the first method of manufacturing a laminated electronic device according to the embodiment.

On the other hand, for forming a lower divergent section 15b, a similar ceramic green sheet 21i is prepared, as shown in FIG. 19. Then, as shown in FIG. 20, in a manner reverse to the formation of the upper divergent section 15c, the sheet 21d is irradiated with a laser from the side on which the supporting sheet 20 is present (upper side in FIG. 20) to form a sinkhole-like throughhole 25b from the supporting sheet 20 side in a manner similar to that formed through the sheet 21d shown in FIG. 16. Then, a conductive paste is filled into this throughhole 25b, as shown in FIG. 21, to form a lower diverting section 15b.

Figure 22:
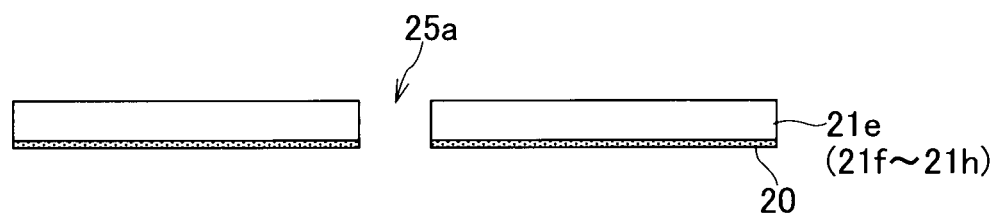
FIG. 22 is a diagram showing one step (a step of forming an intermediate section of the throughhole conductor) in the first method of manufacturing a laminated electronic device according to the embodiment.
Figure 23:
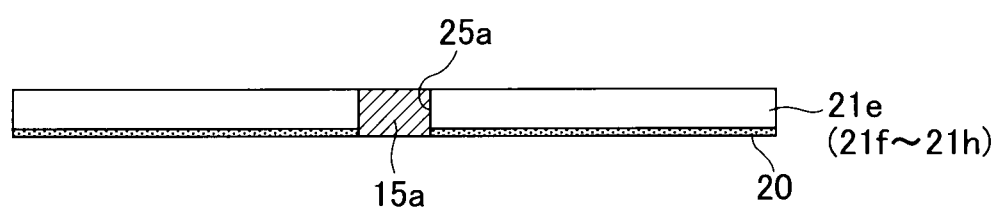
FIG. 23 is a diagram showing one step (a step of forming the intermediate section of the throughhole) in the first method of manufacturing a laminated electronic device according to the embodiment.

Further, as shown in FIG. 22, a vertical throughhole 25a having a fixed diameter is formed through a sheet 21e (21f-21h) to form an intermediate section 15a of the throughhole conductor 15. This throughhole 25a is formed through a mechanical piercing process, preferably through a so-called punching process which involves piercing the sheet while sandwiching the same with a male die and a female die. While the piercing can also be done by drilling, the punching can complete the piercing in a shorter time without substantially producing shavings. Then, as shown in FIG. 23, a conductive paste is filled into the throughhole 25a as well to form the intermediate section 15a of the throughhole conductor 15.

Figure 24:
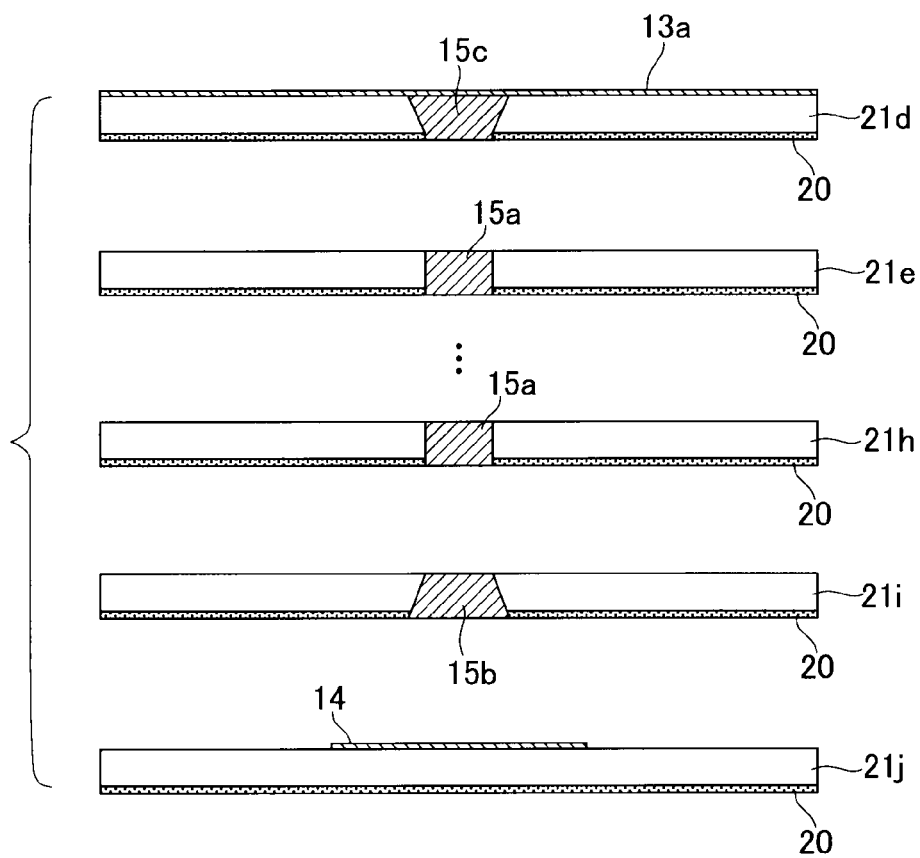
FIG. 24 is a diagram showing one step (a step of laminating sheets) in the first method of manufacturing a laminated electronic device according to the embodiment.
Figure 25:
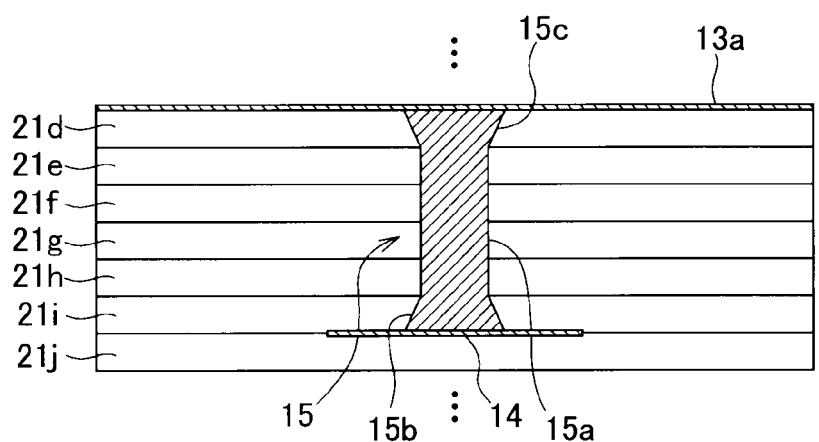
FIG. 25 is a diagram showing one step (how sheets are laminated) in the first method of manufacturing a laminated electronic device according to the embodiment.

After thus forming the upper divergent section 15c, lower divergent section 15b, and intermediate section 15a of the throughhole conductor through the sheets 21d-21i associated therewith, these sheets 21d-21i are laid one on another in alignment with one another, and then are bonded, while heating, to create a laminated sheet, as shown in FIGS. 24 and 25.

Figure 21:
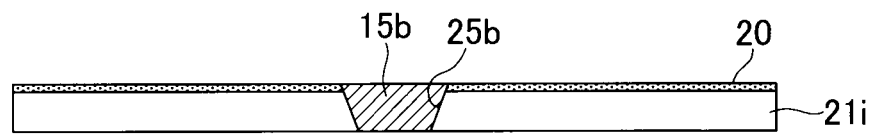
FIG. 21 is a diagram showing one step (a step of forming the lower divergent section of the throughhole conductor) in the first method of manufacturing a laminated electronic device according to the embodiment.

It should be noted that in this event, the sheet 21i (sheet in FIG. 21) including the lower divergent section 15b is turned up side down from the state shown in FIG. 21, before it is laminated. Also, before the sheets 21d-21i (and sheet 21j as well) are laminated, the supporting film 20 adhered to each sheet 21d-21i should be peeled off and removed from the sheet. Further, the sheet 21j is laminated on the bottom of the sheet 21i which includes the lower divergent section 15b. The sheet 21j includes a conductive film 14 on the surface, which is formed to be electrically connected to the lower divergent section 15b. Also, on the bottom of the sheet 21j including the conductive film 14, and on the top of the sheet 21d including the upper divergent section 15c, further sheets (not shown) may be laminated as appropriate, including the sheets 21a-21c shown in FIG. 2 and the sheet 21k including the ground electrode 16 on its top.

Also, while the figures show a portion corresponding to one electronic device (filter) 11, this manufacturing method as well as a second manufacturing method, later described, are intended to simultaneously form a plurality of chips 11 in a collective manner, where a plurality of filters 11 are simultaneously formed by laminating the sheets 21a-21k. Then, after the lamination, the sheets are cut into individual chips 11 which are then sintered.

[Second Manufacturing Method]

Next, a second method of manufacturing an electronic device according to the foregoing embodiment will be described with reference to FIGS. 26 to 31. The first manufacturing method described above previously forms the throughhole conductor (components of the throughhole conductor 15a, 15b, 15c) through the respective sheets 21d-21i associated with the throughhole conductor 15 before laminating them, whereas the second manufacturing method tapers both end portions of a throughhole conductor 15, which is the feature of the present invention, after laminating sheets 21d-21i through which the throughhole 15 should be formed.

Figure 26:
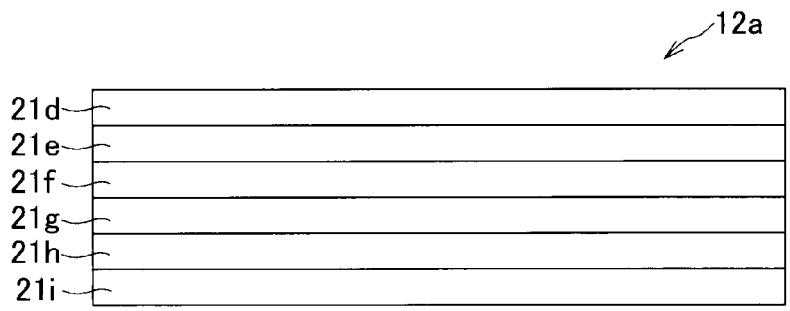
FIG. 26 is a diagram showing one step (how sheets are laminated) in a second method of manufacturing a laminated electronic device according to the embodiment.
Figure 27:
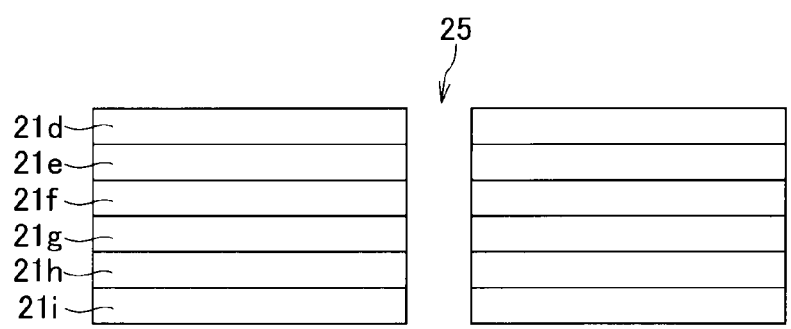
FIG. 27 is a diagram showing one step (a step of forming a throughhole for a throughhole conductor) in the second method of manufacturing a laminated electronic device according to the embodiment.
Figure 28:
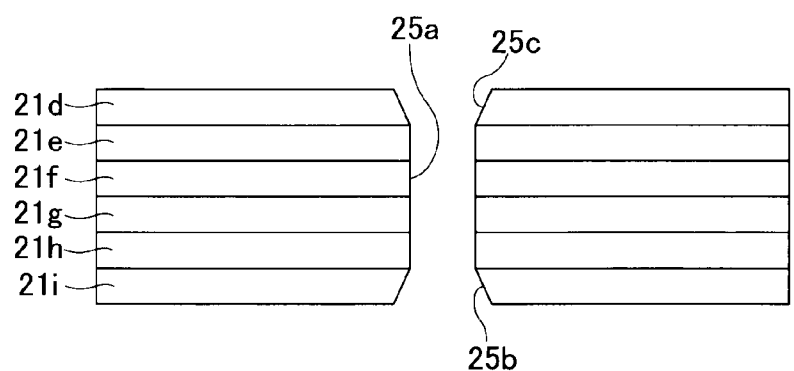
FIG. 28 is a diagram showing one step (a step of tapering the throughhole for the throughhole conductor) in the second method of manufacturing a laminated electronic device according to the embodiment.

Specifically, a throughhole 25 for formation of a throughhole conductor is extended through a laminated sheet 12a comprised of a plurality of laminated ceramic green sheets 21d-21i shown in FIG. 26 (see FIG. 27). This piercing of the throughhole may rely on punching (forcing punching) in a manner similar to the first manufacturing method. Next, the throughhole 25 thus formed is tapered in both end portions 25b, 25c, as shown in FIG. 28. Specifically, an opening 25c on the top of the throughhole 25 and an opening 25b on the bottom of the same are respectively irradiated with laser light to process these openings (edges) 25b, 25c into tapered shape. Alternatively, this tapering process may be performed through a mechanical process similar to that described in the first manufacturing method (for example, the end portions of the throughhole 25 are expanded by forcedly punching them into a tapered shape).

Figure 29:
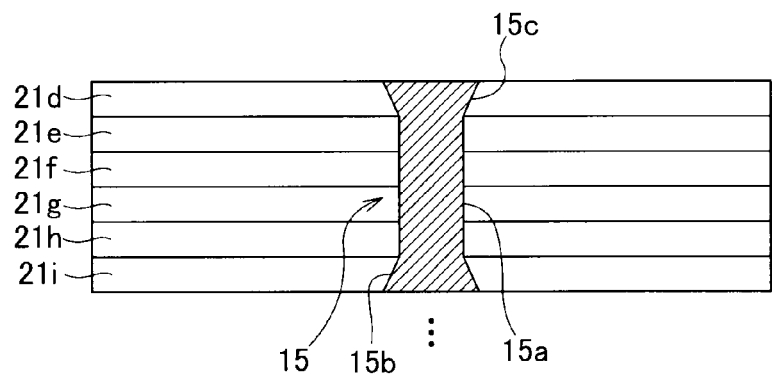
FIG. 29 is a diagram showing one step (how the throughhole conductor is formed) in the second method of manufacturing a laminated electronic device according to the embodiment.
Figure 30:
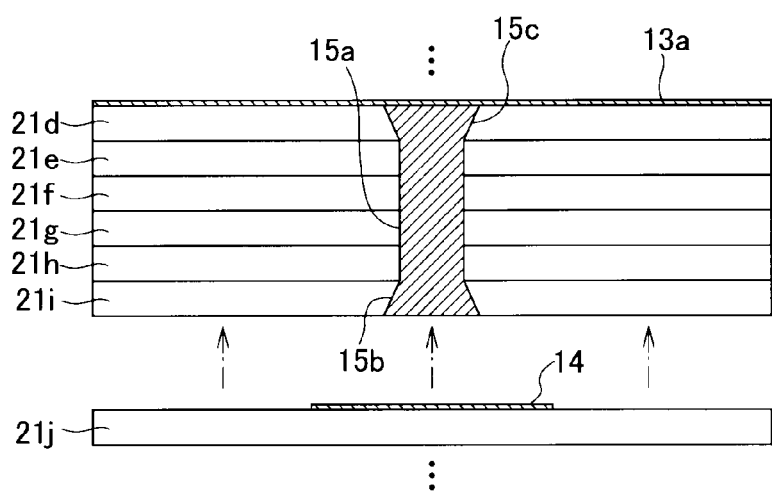
FIG. 30 is a diagram showing one step (a step of laminating sheets) in the second method of manufacturing a laminated electronic device according to the embodiment.
Figure 31:
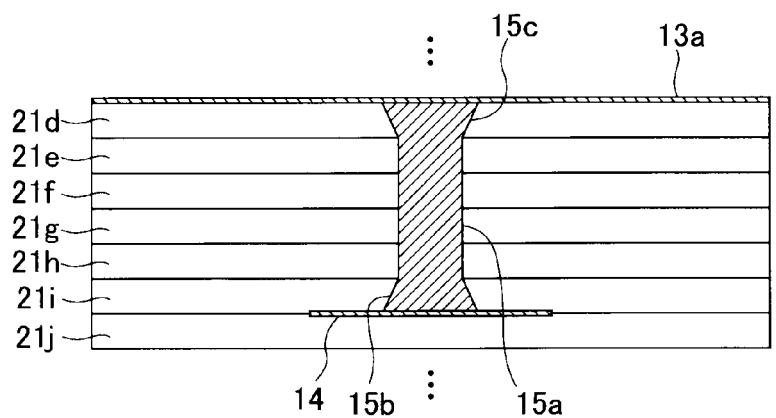
FIG. 31 is a diagram showing one step (how sheets are laminated) in the second method of manufacturing a laminated electronic device according to the embodiment.

Then, as shown in FIG. 29, a conductive paste is filled into the throughhole 25 to form a throughhole conductor 15, and as shown in FIGS. 30 and 31, a conductive pattern (conductive film) 13a is formed to be electrically connected to an upper end portion (upper divergent section) 15c of the throughhole conductor 15. Also, a conductive film 14 is disposed to be electrically connected to the lower end portion (lower divergent section) 15b of the throughhole conductor 15. The conductive film 14 connected to the lower divergent section 15b may be implemented, for example, by further laminating a ceramic green sheet 21j including the conductive film 14 on the surface. Also, on the bottom of the lowermost sheet 21j among the illustrated sheets, and on the top of the uppermost sheet 21d among the illustrated sheets, ceramic green sheets each including a conductive pattern may be further be laminated as appropriate, in a manner similar to that described in the first manufacturing method.

What is claimed is:

1. A laminated electronic device comprising:
   two or more wiring layers including a first wiring layer and a second wiring layer;
   an insulating layer interposed between said first wiring layer and said second wiring layer;
   a through conductor extending through said insulating layer to electrically connect a first conductor disposed on said first wiring layer to a second conductor disposed on said second wiring layer; and
   one or more resonators, wherein
   said through conductor includes a divergent section having a diameter which is gradually larger toward said first conductor, said divergent section being formed in one end portion of said through conductor, said one end portion serving as a connection to said first conductor, said through conductor includes an intermediate section having a substantially fixed diameter, and said divergent section being in a frusto-conical shape, said divergent section includes one end surface being continuous to said intermediate section and having a diameter substantially identical to the diameter of said intermediate section, said one end surface serving as a connection to said intermediate section, and another end surface having a diameter larger than the diameter of the one end surface, the diameter of the another end surface of said divergent section P is substantially equal to (2L+H), where H represents the diameter of said intermediate section, and L represents a height of said divergent section, and the through conductor is connected to the one or more resonators, whereby a Q-value of the one or more resonators is increased.

2. The laminated electronic device according to claim 1, wherein said through conductor further includes another divergent section having a diameter which is gradually larger toward said second conductor, said another divergent section being formed in another end portion of said through conductor, said another end portion serving as a connection to said second conductor.

3. The laminated electronic device according to claim 2, wherein the through conductor includes an electrically-conductive material filled in a through-hole extending through the insulating layer.

4. The laminated electronic device according to claim 1, wherein said through conductor comprises an electrically-conductive material filled in a through-hole extending through said insulating layer.

5. The laminated electronic device according to claim 1, wherein the Q-value of the one or more resonators is increased by virtue of the divergent section.

* * * * *